(12) United States Patent
Endo

(10) Patent No.: US 11,581,899 B2
(45) Date of Patent: Feb. 14, 2023

(54) ANALOG-TO-DIGITAL CONVERTING DEVICE AND CONTROL SYSTEM

(71) Applicant: DENSO WAVE INCORPORATED, Aichi-pref. (JP)

(72) Inventor: Hiroshi Endo, Chita-gun (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 0 days.

(21) Appl. No.: 17/408,847

(22) Filed: Aug. 23, 2021

(65) Prior Publication Data

US 2022/0069832 A1 Mar. 3, 2022

(30) Foreign Application Priority Data

Aug. 26, 2020 (JP) .............................. JP2020-142608

(51) Int. Cl.
| | |
|---|---|
| *H03M 1/12* | (2006.01) |
| *H03M 3/00* | (2006.01) |
| *H03M 1/38* | (2006.01) |
| *H03M 1/10* | (2006.01) |
| *H03M 1/06* | (2006.01) |
| *H03M 1/18* | (2006.01) |

(52) U.S. Cl.
CPC ....... *H03M 1/1245* (2013.01); *H03M 1/0604* (2013.01); *H03M 1/1019* (2013.01); *H03M 1/1071* (2013.01); *H03M 1/1295* (2013.01); *H03M 1/187* (2013.01); *H03M 1/38* (2013.01); *H03M 3/324* (2013.01); *H03M 3/426* (2013.01); *H03M 3/458* (2013.01)

(58) Field of Classification Search
CPC ............. H03M 1/1245; H03M 1/0614; H03M 1/1019; H03M 1/1071
USPC .................. 341/155, 120, 118, 159, 163, 161
See application file for complete search history.

(56) References Cited

U.S. PATENT DOCUMENTS

2012/0101655 A1\* 4/2012 Maruyama .......... H03M 1/1076
701/1

FOREIGN PATENT DOCUMENTS

JP 2011-238450 A 11/2011

\* cited by examiner

*Primary Examiner* — Peguy Jean Pierre
(74) *Attorney, Agent, or Firm* — Oliff PLC

(57) ABSTRACT

An analog-to-digital converting device includes: a main analog-to-digital converter configured to convert an analog signal output from a sensor to a digital signal; and a monitoring unit configured to monitor the digital signal converted by the main analog-to-digital converter. The main analog-to-digital converter is provided by a special purpose IC arranged separately from a microcomputer for controlling the main analog-to-digital converter. The monitoring unit includes multiple sub analog-to-digital converters each of which having a conversion accuracy lower than that of the main analog-to-digital converter and converting the analog signal output from the sensor to a digital signal. The monitoring unit sets a predetermined threshold based on conversion values of the digital signals converted by the multiple sub analog-to-digital converters, and compares a conversion value of the digital signal converted by the main analog-to-digital converter with the predetermined threshold.

13 Claims, 7 Drawing Sheets

| OBJECT | CONVERSION TYPE | CONVERSION TIME | CONVERSION ACCURACY |
|---|---|---|---|
| MAIN ADC | ΔΣ | △ | ○ |
| 1ST MCU (SUB ADC) | SAR | ○ | △ |
| 2ND MCU (SUB ADC) | SAR | ○ | △ |

ANALOG-TO-DIGITAL CONVERTING DEVICE AND CONTROL SYSTEM

CROSS REFERENCE TO RELATED APPLICATION

The present application claims the benefit of priority from Japanese Patent Application No. 2020-142608 filed on Aug. 26, 2020. The entire disclosure of the above application is incorporated herein by reference.

TECHNICAL FIELD

The present disclosure relates to an analog-to-digital converting device and a control system including the analog-to-digital converting device.

BACKGROUND

Conventionally, a control system for industrial equipment including an analog-to-digital converting device as an input module is known.

SUMMARY

An analog-to-digital converting device includes: a main analog-to-digital converter configured to convert an analog signal output from a sensor to a digital signal; and a monitoring unit configured to monitor the digital signal converted by the main analog-to-digital converter. The main analog-to-digital converter is provided by a special purpose IC arranged separately from a microcomputer for controlling the main analog-to-digital converter. The monitoring unit includes multiple sub analog-to-digital converters each of which having a conversion accuracy lower than that of the main analog-to-digital converter and converting the analog signal output from the sensor to a digital signal. The monitoring unit sets a predetermined threshold based on conversion values of the digital signals converted by the multiple sub analog-to-digital converters, and compares a conversion value of the digital signal converted by the main analog-to-digital converter with the predetermined threshold.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
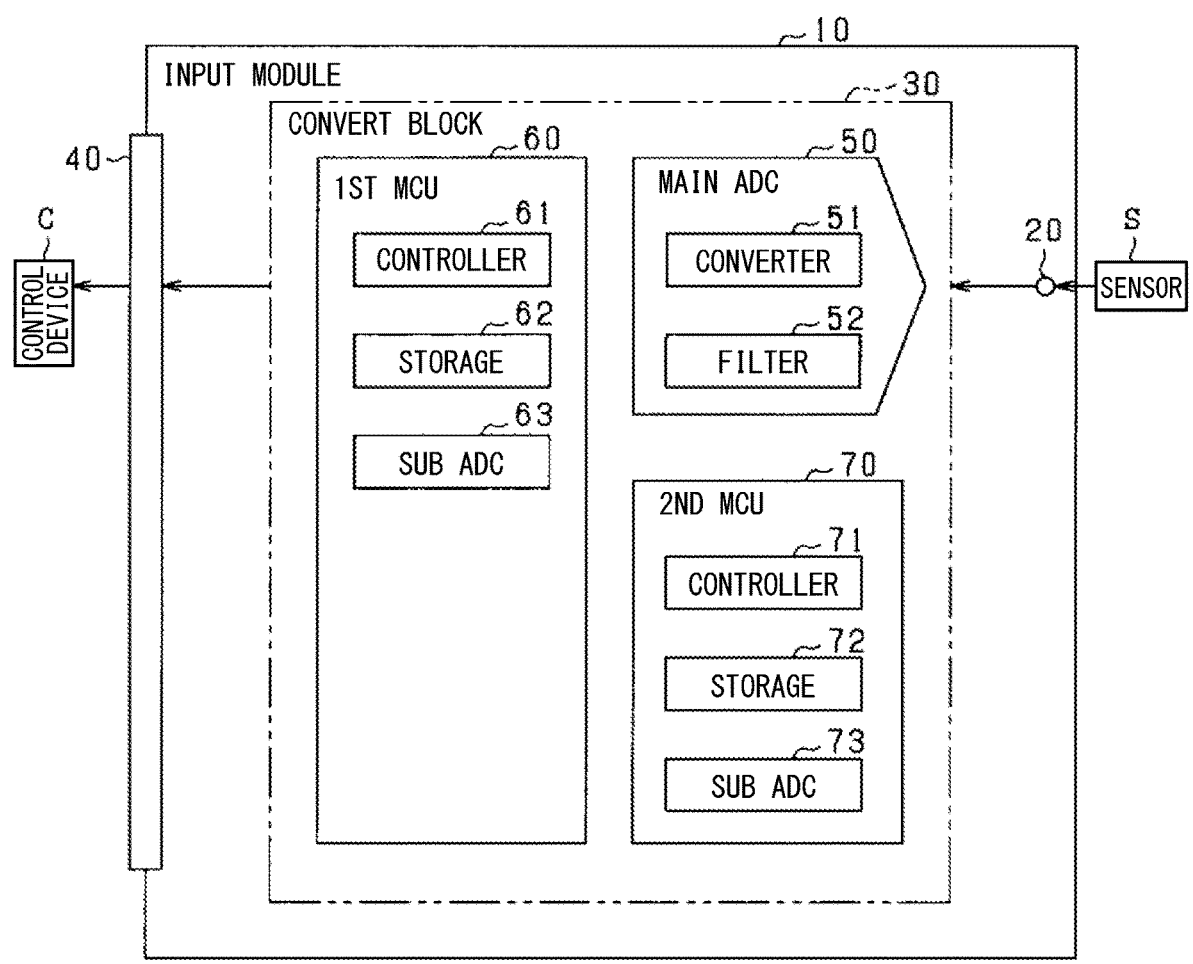
FIG. 1 is a block diagram showing an input module according to an embodiment of the present disclosure.

A control system for industrial equipment usually includes an analog-to-digital converting device (input module) that converts an analog signal output from a sensor (for example, a temperature sensor or a flow rate sensor) into a digital signal, and then outputs the converted digital signal to a control device such as a controller.

In the control system described above, since a dedicated IC different from a microcomputer is adopted as the analog-to-digital converting device included in the input module. Thus, it is possible to easily secure high accuracy of the analog-to-digital conversion of the control system. This configuration also improves a performance of the industrial equipment. However, in the above configuration, it is more difficult to determine a failure of the dedicated analog-to-digital converting device that is provided separately from the microcomputer compared with a general-purpose product, such as an analog-to-digital converting device built in a microcomputer. Therefore, even if the conversion to a digital signal is not properly performed due to a failure of the analog-to-digital converting device, an abnormal result of the digital signal (for example, a digital signal including an error exceeding a permissible tolerance) is likely to be input to the controller without any correction. This may cause adverse effect to a reliability improvement of the control system (industrial equipment). As described above, improvement is still needed to be made in the configuration of the analog-to-digital converting device for increasing the reliability of the control system while securing high operation accuracy of the control system.

According to an aspect of the present disclosure, an analog-to-digital converting device applied to a control system that controls an industrial equipment as a control target is provided. The analog-to-digital converting device includes: a main analog-to-digital converter configured to convert an analog signal, which is output from a sensor and input to the analog-to-digital converting device, to a digital signal; and a monitoring unit configured to monitor the digital signal converted by the main analog-to-digital converter. The main analog-to-digital converter is provided by an analog-to-digital conversion purpose integrated circuit arranged separately from a microcomputer that controls the main analog-to-digital converter. The monitoring unit includes: a plurality of sub analog-to-digital converters each of which having a conversion accuracy lower than a conversion accuracy of the main analog-to-digital converter and converting the analog signal, which is output from the sensor and input to the analog-to-digital converting device, to a digital signal; a setting unit setting a predetermined threshold based on conversion values of the digital signals converted by the plurality of sub analog-to-digital converters; and a comparing unit comparing a conversion value of the digital signal converted by the main analog-to-digital converter with the predetermined threshold set by the setting unit.

In the above configuration, the main analog-to-digital converter is provided by a special purpose integrated circuit for analog-to-digital conversion, and is provided separately from the microcomputers. Thus, compared with the analog-to-digital converters built in the microcomputers, restrictions on improvement of conversion accuracy and the like can be suitably relaxed. This configuration can provide high accuracy of the control system. The above-described analog-to-digital converting device includes multiple sub analog-to-digital converters in addition to the main analog-to-digital converter, and the analog signal output from the sensor is converted into the digital signal by each of the main analog-to-digital converter and the multiple sub analog-to-digital converters. Then, a predetermined threshold (permissible range) is set based on conversion values of the digital signals converted by the sub analog-to-digital converters. By comparing the predetermined threshold with the conversion data of the main analog-to-digital converter, it is possible to identify that an error exceeding the permissible range has occurred in the conversion value of the main analog-to-digital converter. In the above-described analog-to-digital converting device, a reliability of the predetermined threshold is improved by using, in combination, multiple sub analog-to-digital converters which have low conversion accuracies and function as monitoring analog-to-digital converters. As a result, it is possible to improve the reliability of the control system while securing the control accuracy of the control system.

With the above-described configuration, it is possible to prevent the input of the conversion value (conversion value by the main analog-to-digital converter) to a controller from being significantly delayed due to the addition of the monitoring function. The conversion accuracy of the analog-to-digital converter is related to the conversion time required for conversion operation. When the accuracy of the conversion operation is increased, the conversion time tends to extend. As described above, the sub analog-to-digital converters each of which having a lower conversion accuracy than that of the main analog-to-digital converter is adopted. As a result, it is possible to prevent the input of the conversion value (conversion value by the main analog-to-digital converter) to the controller from being significantly delayed due to the addition of the monitoring function.

In one embodiment, the plurality of sub analog-to-digital converters include a first analog-to-digital converter and a second analog-to-digital converter. The monitoring unit includes: a first microcomputer in which the first analog-to-digital converter is included in built-in manner; and a second microcomputer in which the second analog-to-digital converter is included in built-in manner. The first microcomputer is configured to monitor an operation of the second microcomputer and the second microcomputer is configured to monitor an operation of the first microcomputer.

When the predetermined threshold is set based on the conversion values of the built-in sub analog-to-digital converters of the microcomputers even in a case where a reliability of the sub analog-to-digital converters cannot be guaranteed due to an operation abnormality occurred in one of the microcomputers, the following problem will occur. The conversion value of the main analog-to-digital converter, which should be determined to be abnormal due to exceeding of the predetermined threshold, may be output to the controller of the control system without any correction. With consideration of this point, the operation abnormality of the microcomputers can be quickly detected by mutual monitoring configuration of the multiple microcomputers. Thus, the output of the conversion data that should be determined to abnormal can be avoided.

In one embodiment, the plurality of sub analog-to-digital converters include a first analog-to-digital converter and a second analog-to-digital converter. The first analog-to-digital converter has a conversion accuracy of the digital signal identical to or approximately same as a conversion accuracy of the second analog-to-digital converter In setting of the predetermined threshold based on the conversion values of the first analog-to-digital converter and the conversion value of the second analog-to-digital converter, the conversion accuracies of the sub analog-to-digital converters are set to be identical to one another or approximately the same as one another. This configuration eases processing of the conversion values by the sub analog-to-digital converter, and thereby simplifying the setting of the predetermined threshold.

As described above, the first analog-to-digital converter has the conversion accuracy of the digital signal identical to or approximately same as the conversion accuracy of the second analog-to-digital converter. Usually, the conversion accuracy of each converter is defined in a catalog value of the product specification. The product specifications of the multiple sub analog-to-digital converters are the same. Specifically, the practical conversion accuracies of the sub analog-to-digital converters may be completely the same, or the practical conversion accuracies of the sub analog-to-digital converters may slightly different due to individual differences.

In one embodiment, the setting unit sets a lower limit of the predetermined threshold based on a relatively large conversion value among the conversion value of the first analog-to-digital converter and the conversion value of the second analog-to-digital converter. The setting unit sets an upper limit of the predetermined threshold based on a relatively small conversion value among the conversion value of the first analog-to-digital converter and the conversion value of the second analog-to-digital converter.

With the configuration where the lower limit of the predetermined threshold is set based on the relatively large conversion value and the upper limit of the predetermined threshold is set based on the relatively small conversion value, the monitoring accuracy can be improved compared with a case where the lower limit of the predetermined threshold is set based on the relative small conversion value and the upper limit of the predetermined threshold is set based on the relatively large conversion value.

In one embodiment, the setting unit sets a lower limit of the predetermined threshold by subtracting a predetermined positive value from a relatively large conversion value among the conversion value of the first analog-to-digital converter and the conversion value of the second analog-to-digital converter. The setting unit sets an upper limit of the predetermined threshold by adding the predetermined positive value to a relatively small conversion value among the conversion value of the first analog-to-digital converter and the conversion value of the second analog-to-digital converter.

With the configuration where the lower limit of the predetermined threshold is set by subtracting the predetermined positive value from the relatively large conversion value and the upper limit of the predetermined threshold is set by adding the predetermined positive value to the relatively small conversion value, the monitoring accuracy can be improved compared with a case where the lower limit of the predetermined threshold is set by subtracting the predetermined positive value from the relatively small conversion value and the upper limit of the predetermined threshold is set by adding the predetermined positive value to the relatively large conversion value.

In one embodiment, the setting unit decreases the upper limit of the predetermined threshold according to the conversion accuracy of the first or second analog-to-digital converter, and increases the lower limit of the predetermined threshold according to the conversion accuracy of the first or second analog-to-digital converter.

By correcting the predetermined threshold with consideration of the conversion accuracy of the sub analog-to-digital converter, the monitoring accuracy can be improved.

In one embodiment, the monitoring unit compares the conversion value of the digital signal converted by the first analog-to-digital converter with the conversion value of the digital signal converted by the second analog-to-digital converter. When a difference between the conversion value of the digital signal converted by the first analog-to-digital converter and the conversion value of the digital signal converted by the second analog-to-digital converter is equal to or greater than a predetermined difference threshold, the monitoring unit executes a predetermined error process. The predetermined difference threshold is previously determined based on the conversion accuracy of the first or second analog-to-digital converter.

When the difference between the conversion values of the two sub analog-to-digital converters is monitored and the predetermined error process is executed in response to the difference being larger than the predetermined difference threshold, the reliability of the setting of the predetermined threshold can be further improved.

In one embodiment, the main analog-to-digital converter is provided by a $\Delta\Sigma$ type analog-to-digital converter, and each of the plurality of sub analog-to-digital converters is provided by a successive approximation register (SAR) type analog-to-digital converter.

When the main analog-to-digital converter is provided by the $\Delta\Sigma$ type analog-to-digital converter and the sub analog-to-digital converter is provided by the successive approximation register (SAR) type analog-to-digital converter, it is possible to improve the reliability of the control system while securing the control accuracy of the control system.

In one embodiment, the conversion accuracy of each of the plurality of sub analog-to-digital converters is lower than the conversion accuracy of the main analog-to-digital converter and a conversion time required for each of the plurality of sub analog-to-digital converters is shorter than a conversion time required for the main analog-to-digital converter. In a case where the monitoring unit outputs a conversion start instruction to the main analog-to-digital converter in response to a predetermined start trigger being activated, the monitoring unit starts to store the conversion values or correlation values related to the conversion values of the plurality of sub analog-to-digital converters. The setting unit waits for a completion of conversion by the main analog-to-digital converter, calculates an average value based on the stored conversion values or the correlation values, and sets the predetermined threshold based on the calculated average value.

By setting the predetermined threshold after the completion of conversion by the main analog-to-digital converter, it is possible to suppress a decrease in monitoring accuracy due to a difference between the conversion completion time of the main analog-to-digital converter and the conversion completion time of the sub analog-to-digital converter. While waiting for the completion of conversion by the main analog-to-digital converter, the conversion values or correlations value related to the conversion values of the sub analog-to-digital converters are accumulated, and the average value is calculated from a certain number of the conversion values. Thus, although the conversion values of the sub analog-to-digital converters having relatively low accuracies are used, the monitoring accuracy can be suitably improved by this configuration.

In one embodiment, the setting unit calculates the average value based on which the predetermined threshold is set by a moving average method.

When the average value is calculated by the moving average, it is possible to prevent a lack of the storing area of the microcomputer and also possible to prevent all storing area of the microcomputer being occupied by the conversion values.

In one embodiment, the plurality of sub analog-to-digital converters include a first analog-to-digital converter and a second analog-to-digital converter. The monitoring unit includes: a first microcomputer in which the first analog-to-digital converter is included; and a second microcomputer in which the second analog-to-digital converter is included. The microcomputer includes: a first storage storing the conversion values or the correlation values related to the conversion values of the first analog-to-digital converter; and a first calculator calculating the average value of the conversion values or the correlation values stored in the first storage. The second microcomputer includes: a second storage storing the conversion values or the correlation values related to the conversion values of the second analog-to-digital converter; and a second calculator calculating the average value of the conversion values or the correlation values stored in the second storage.

The conversion value of the main analog-to-digital converter is compared with the predetermined threshold. Since the predetermined threshold is set corresponding to each time conversion in the sub analog-to-digital converter, the monitoring accuracy can be improved. However, extension of the time period until completion of the calculation of predetermined threshold is not favorable. In the above configuration, each microcomputer is configured to store the conversion values and calculate the average value of the conversion values. Compared with a case where a single microcomputer, instead of multiple microcomputers, is configured to execute those operations executed in multiple microcomputers, a responsiveness in setting of the predetermined threshold can be suitably improved.

In one embodiment, the analog-to-digital converting device further includes an output unit. When a comparison result output from the comparing unit indicates that the conversion value of the digital signal converted by the main analog-to-digital converter is within a range of the predetermined threshold, the output unit outputs the conversion value of the main analog-to-digital converter to the control system of the industrial equipment. When the comparison result output from the comparing unit indicates that the conversion value of the digital signal converted by the main analog-to-digital converter is not within the range of the predetermined threshold, the output unit outputs, instead of the conversion value of the main analog-to-digital converter, a predetermined value indicating the comparison result to the control system of the industrial equipment.

When the conversion value of the main analog-to-digital converter deviates from the predetermined threshold (when it is assumed that the safety accuracy is not ensured), a predetermined value is output instead of the conversion value of the main analog-to-digital converter. With this configuration, it is possible to prevent the control of the industrial equipment from being executed based on the conversion value which has the unsecured safety accuracy.

According to another aspect of the present disclosure, a control system that controls an industrial equipment is provided. The control system includes the above-described analog-to-digital converting device, and controls the industrial equipment based on a digital signal, which is output from the analog-to-digital converting device.

Since the control system includes the above-described analog-to-digital converting device, the reliability of the control system can also be suitably improved. According to another aspect of the present disclosure, an analog-to-digital converting device is provided. The analog-to-digital converting device includes:

a main analog-to-digital converter configured to convert an analog signal, which is output from a sensor and input to the analog-to-digital converting device, to a digital signal; and one or more microcomputers configured to monitor the digital signal converted by the main analog-to-digital converter. The main analog-to-digital converter is provided by an analog-to-digital conversion purpose integrated circuit arranged separately from the one or more microcomputers that monitor the main analog-to-digital converter. The one or more microcomputers include: a plurality of sub analog-to-digital converters each of which having a conversion accuracy lower than a conversion accuracy of the main analog-to-digital converter and converting the analog signal, which is output from the sensor and input to the analog-to-digital converting device, to a digital signal; a setting unit setting a predetermined threshold based on conversion values of the digital signals converted by the plurality of sub analog-to-digital converters; and a comparing unit comparing a conversion value of the digital signal converted by the main analog-to-digital converter with the predetermined threshold set by the setting unit. The analog-to-digital converting device is applied to a control system that controls an industrial equipment as a control target.

The following will describe an embodiment of the present disclosure with reference to the accompanying drawings. This embodiment describes a specific example of an input module (corresponding to an analog-to-digital converting device) applied to a control system (for example, a valve control system) of an industrial equipment used in a factory, plant, or the like.

As shown in FIG. 1, an input module 10 includes an input terminal 20 to which an analog signal is input from a sensor S (for example, a temperature sensor or a flow rate sensor), a converting block 30 having a main analog-to-digital converter (ADC) 50 that converts the inputted analog signal to a digital signal, and a backplane 40 provided by a high-speed communication bus connecting the input module 10 with a control device C. The control device C may be a control device for valve control. In the present embodiment, the sensor S corresponds to a "sensor unit", and the main ADC 50 corresponds to a "main analog-to-digital converter".

The converting block 30 includes multiple microcomputers (a first MCU 60 and a second MCU 70) and the main ADC 50. The main ADC 50 is an integrated circuit for AD conversion, and is provided separately from the first MCU 60 and the second MCU 70. The main ADC 50 includes a converter 51, which is provided by a ΔΣ modulator that converts an analog signal to a digital signal, and a filter 52, which is provided by a digital filter that limits a band of the converted data and performs decimation to the converted data. The main ADC 50 performs analog-to-digital conversion based on a command (control signal described later) from the first MCU 60, and the digital signal converted by the main ADC 50 is set in the backplane 40. In the present embodiment, the main ADC 50 has a conversion accuracy of ±0.05% at full scale. In the following description, a value of the digital signal is referred to as conversion value or conversion data.

In order to easily realize high accuracy of the input module 10 (control system) and improve the performance of industrial equipment, the main ADC 50 is provided by a dedicated circuit product (specifically, ΔΣ type ADC) different from the microcomputer. However, it is more difficult to specify a failure of an ADC provided separately from the microcomputer compared with a general-purpose product of ADC built in the microcomputer. Therefore, even if the conversion to a digital signal is not performed normally due to a failure in the ADC, the conversion data (for example, improper conversion data including an error exceeding a permissible tolerance) is highly likely to be input to the control device C without any correction. This may cause adverse effect to a reliability improvement of the control system (industrial equipment). The present embodiment may solve above-described difficulty. The following will describe details of the present embodiment.

The first MCU 60 includes a controller 61 provided by a CPU and a storage 62 provided by ROM, RAM, and buffer for storing various programs such as control programs and various data for control. The second MCU 70 includes a controller 71 provided by a CPU and a storage 72 provided by ROM, RAM, and buffer for storing various programs such as control programs and various data for control. The first MCU 60 and the second MCU 70 are connected with one another in a communicable manner.

Figures 2, 3:
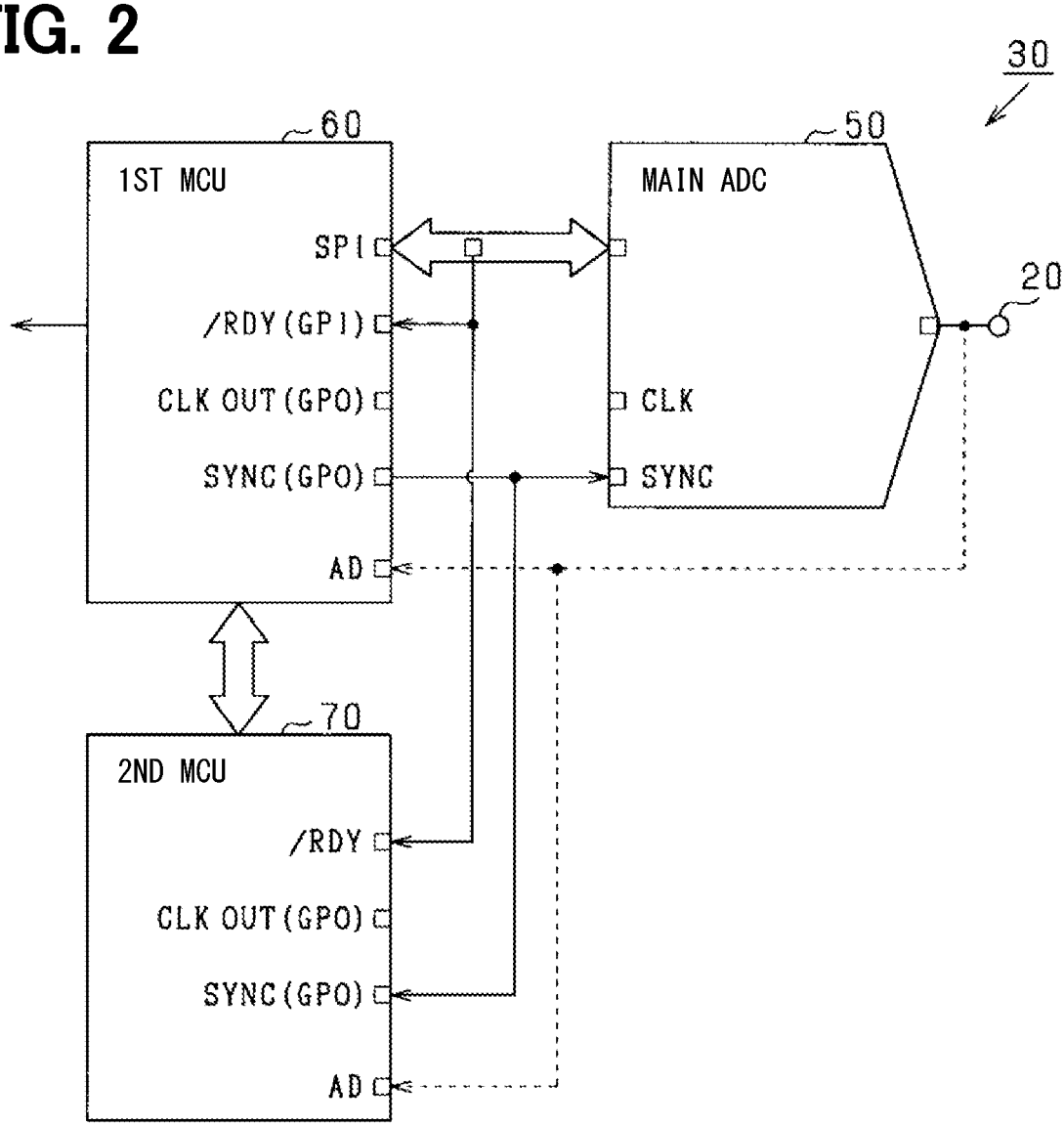
FIG. 2 is a schematic diagram showing a conversion block.
FIG. 3 is a table showing comparison of multiple ADCs.

As shown in FIG. 2, the analog signal from the sensor S is input to the first MCU 60 and the second MCU 70 in addition to the main ADC 50. The first MCU 60 and the second MCU 70 each has a built-in sub ADC 63, 73, which is provided by a successive approximation register (SAR) type ADC, and the analog signal from the sensor S is converted from the analog signal to the digital signal by each sub ADC 63, 73. The sub ADC 63 included in the first MCU 60 corresponds to a first sub ADC, and the sub ADC 73 included in the second MCU 70 corresponds to a second sub ADC. The controller 61 of the first MCU 60 sets, based on the conversion data of the sub ADC 63, 73, a reference range DE which is a reference used for determine whether an accuracy of the conversion data of the main ADC 50 reaches a reference accuracy (in the present embodiment, the reference accuracy is set to ±1% at full scale). The first MCU 60 compares the conversion data of the main ADC 50 with the reference range for determining whether the conversion data of the main ADC 50 satisfies the reference accuracy. This determination of accuracy is also referred to as diagnose. In the present embodiment, the first MCU 60 and the second MCU 70 correspond to a monitoring unit of the main ADC 50. Further, the first MCU 60 corresponds to a first microcomputer, and the second MCU 70 corresponds to a second microcomputer.

Although the SAR type sub ADCs 63 and 73 have lower conversion accuracy than the ΔΣ type main ADC 50, an accuracy of the reference range DE can be secured by using multiple sub ADCs 63, 73 inferior in conversion accuracy in combination with one another. That is, the accuracy of the diagnosis can be improved by using multiple sub ADCs.

Figure 4:
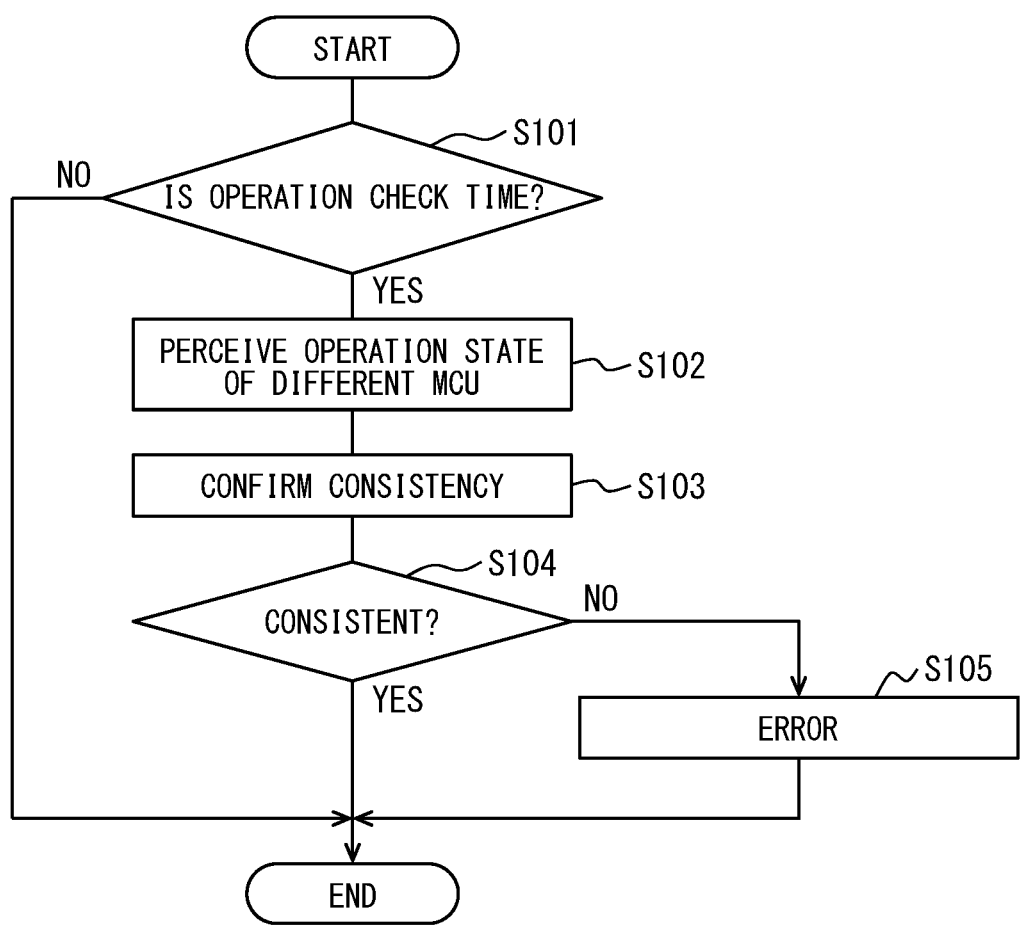
FIG. 4 is a flowchart showing an operation confirmation process executed by each MCU.

For example, when the reference range DE is set based on the conversion data of the sub ADCs 63 and 73 even in a case where a reliability of the sub ADC 63, 73 cannot be guaranteed due to an operation abnormality occurred in any one of the MCUs 60 and 70, the following problem will occur. That is, the conversion data (conversion data of the main ADC 50) that should be determined to not satisfy the reference accuracy in a properly operating state is erroneously determined to satisfy the reference accuracy and is output to the control device C without any correction. The first MCU 60 and the second MCU 70 each is configured to mutually monitor an operation of one another in order to suppress the occurrence of such problem. The following will describe a mutual monitoring process, which is also referred to as an operation confirmation process, with reference to FIG. 4. The process shown in FIG. 4 is executed by the controllers 61 and 71 of the MCUs 60 and 70. The operation confirmation process is a process executed by each of the controllers 61, 71 as a part of a periodic process.

In the operation confirmation process, first in S101, the controller determines whether an operation check time is reached. When a negative determination is made in S101, the operation confirmation process is terminated. When an affirmative determination is made in S101, the process proceeds to S102. In S102, the operation state of the different MCU is perceived. Information indicating an operation pattern of different MCU 60, 70 is also stored in the storage 62, 72 of own MCU, and the information indicating the operation pattern of each ECU is shared in this manner. In S103, the controller determines whether the stored operation pattern of the different MCU is consistent with the current operation state of the different MCU.

In a case where the current operation state of the different MCU is consistent with the stored operation pattern of the different MCU, an affirmative determination is made in S104, and the operation confirmation process is ended. When the current operation state of the different MCU is not consistent with the stored operation pattern, a negative determination is made in S104, and the process proceeds to S105. In S105, an error process is executed, and then the operation confirmation process is ended.

In the error process of S105, the conversion data to be set in the backplane 40 is forcibly rewritten to special data (for example, 0V/0 mA) corresponding to the occurrence of the error. In the present embodiment, the special data functions as a notification means that notifies the control device C of an occurrence of operation abnormality in the input module 10 (specifically, in the MCUs 60 and 70). Then, the conversion data of the main ADC 50 is restricted from being set in the backplane 40 at least until the error removing condition is satisfied (for example, until the error removing operation is executed). As described above, by mutual operation state monitoring of the MCUs 60 and 70, the conversion data of the main ADC 50 can be prevented from being input to the control device C in a case where a reliability of the reference range DE cannot be guaranteed due to the operation abnormality of the MCUs 60 and 70.

Figure 5:
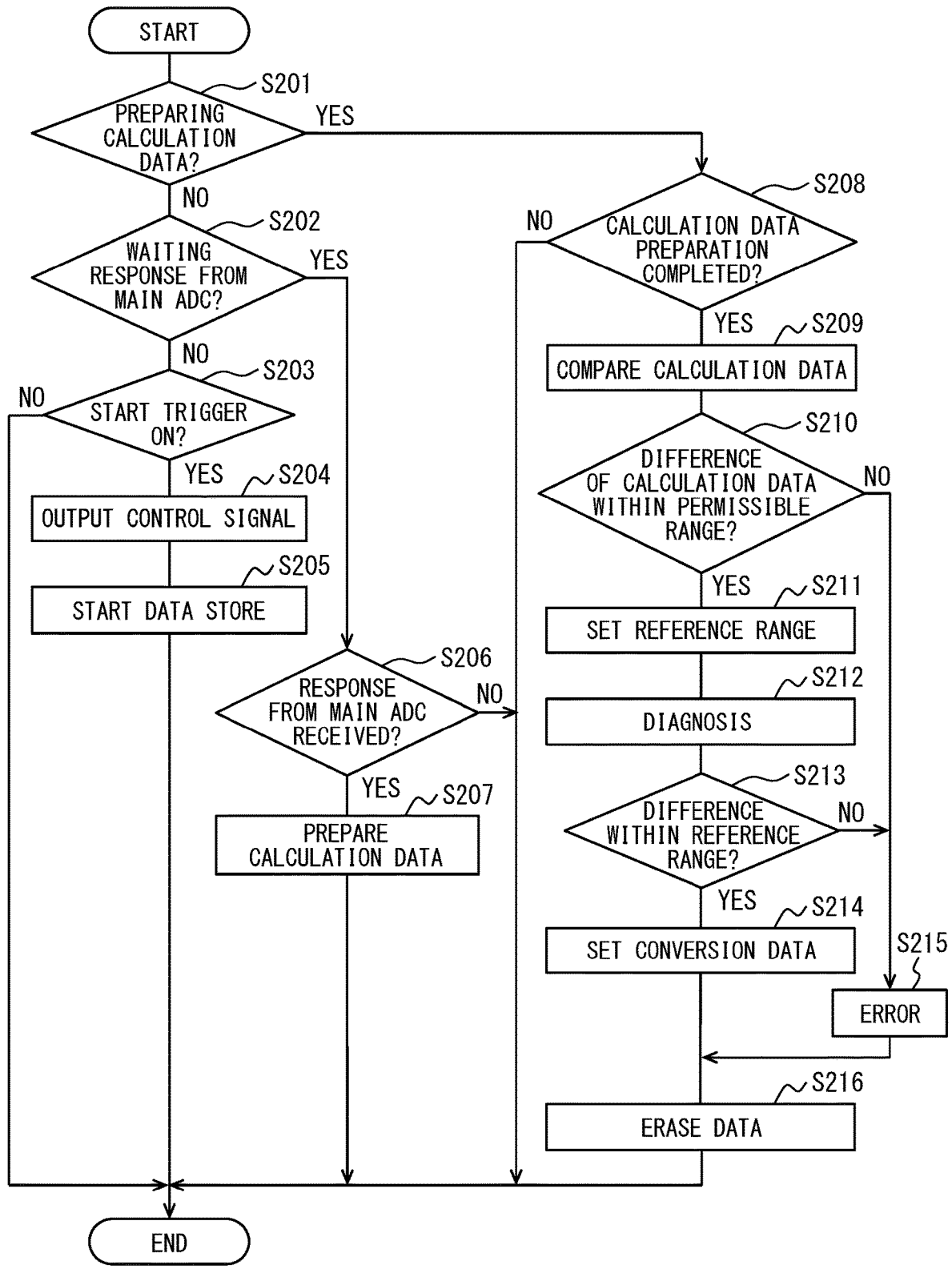
FIG. 5 is a flowchart showing a diagnosis process executed by a first MCU.

The following will describe a process (diagnosis process) for determining whether the conversion data of the main ADC satisfies the above-mentioned reference accuracy with reference to FIG. 5. The diagnosis process is executed by the controller 61 of the first MCU 60 as a part of a periodic process.

When the diagnosis process starts, in S201, the controller 61 determines whether the data (hereinafter also referred to as calculation data) for setting the reference range DE is being prepared. If a negative determination is made in S201, the process proceeds to S202. As described above, the main ADC 50 shown in the present embodiment is a ΔΣ type ADC. The ΔΣ type ADC has a high conversion accuracy, but requires a certain amount of time for conversion. Therefore, when the control signal (synchronous signal) that is a command to start analog-to-digital conversion is output from the first MCU 60 to the main ADC 50, there is a certain time lag until the main ADC 50 completes the conversion and outputs the conversion data to the first MCU 60. In S202, the controller 61 determines whether the response from the main ADC 50 is being awaited (in other words, the main ADC 50 is in executing state of the conversion process). If a negative determination is made in S202, the process proceeds to S203. The output of the control signal (synchronous signal) from the MCU 60 to the main ADC 50 indicates that the main ADC 50 has started the conversion process, and the MCU 60 successively performs AD conversion and accumulates data until a response from the main ADC 50 is received.

In S203, the controller 61 determines whether an acquisition condition for acquiring the conversion data of the main ADC 50 is satisfied (for example, whether a start trigger is ON state or activated). If a negative determination is made in S203, the current diagnosis process is ended. If an affirmative determination is made in S203, the process proceeds to S204, and the control signal is output to the main ADC 50. After executing a data accumulation start process in S205, the current diagnosis process is ended. In the data accumulation start process of S205, the accumulation of conversion data converted by the sub ADC 63 is started.

As described above, after the main ADC 50 is instructed to perform AD conversion, there is a waiting period until the conversion data of the main ADC is acquired. In the present embodiment, the conversion data of the sub ADC 63 is accumulated during the waiting period, and a calculation similar to the AZ calculation can be executed by using the accumulated conversion data group to prepare the calculation data. The following will describe a configuration for executing the calculation.

Figure 6:
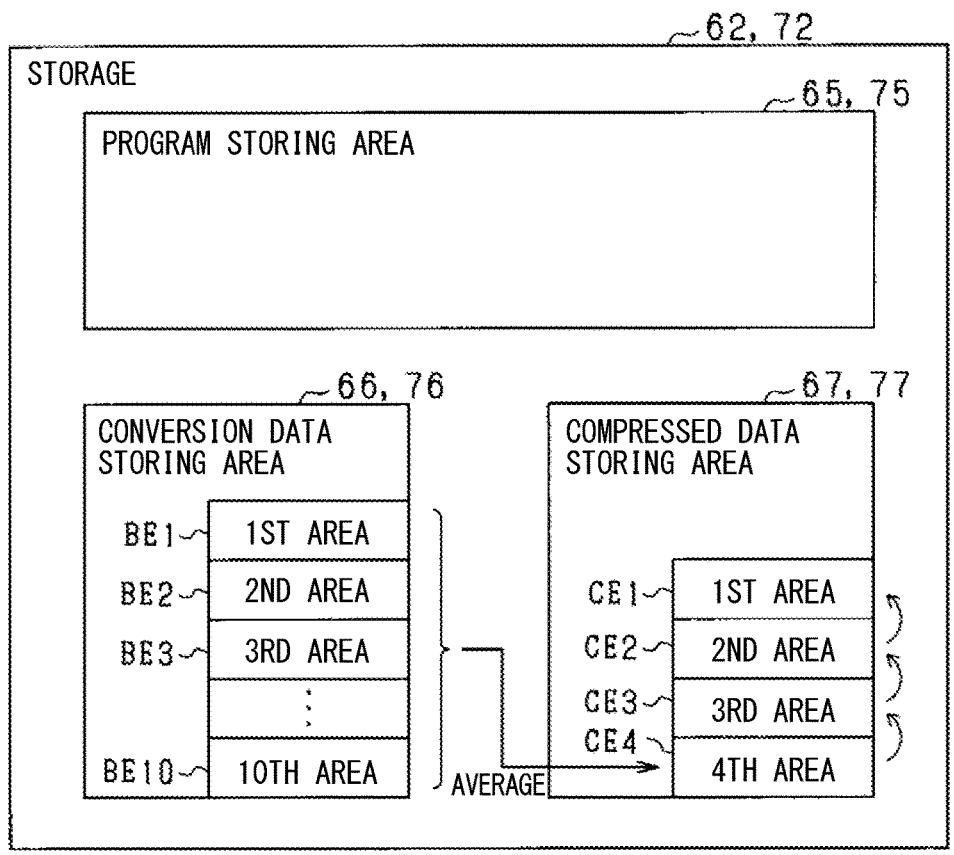
FIG. 6 is a schematic view showing a storage of each MCU.

As shown in FIG. 6, the storage 62 includes a conversion data storing area 66, and the conversion data storing area 66 includes a first area BE1 to a tenth area BE10. The conversion data converted by the sub ADC 63 is stored in the first area BE1, the second area BE2, the third area BE3, . . . , and the tenth area in order. When all of the first area BE1 to the tenth area BE10 are full, the average value of the conversion data is calculated and the conversion data stored in the first area BE1 to the tenth area BE10 are deleted. Then, the calculated result is stored, as compressed data, in the compressed data storing area 67 of the storage 62. As described above, by compressing the conversion data, it is possible to prevent the number of data to be stored from becoming excessively large.

Figure 7:
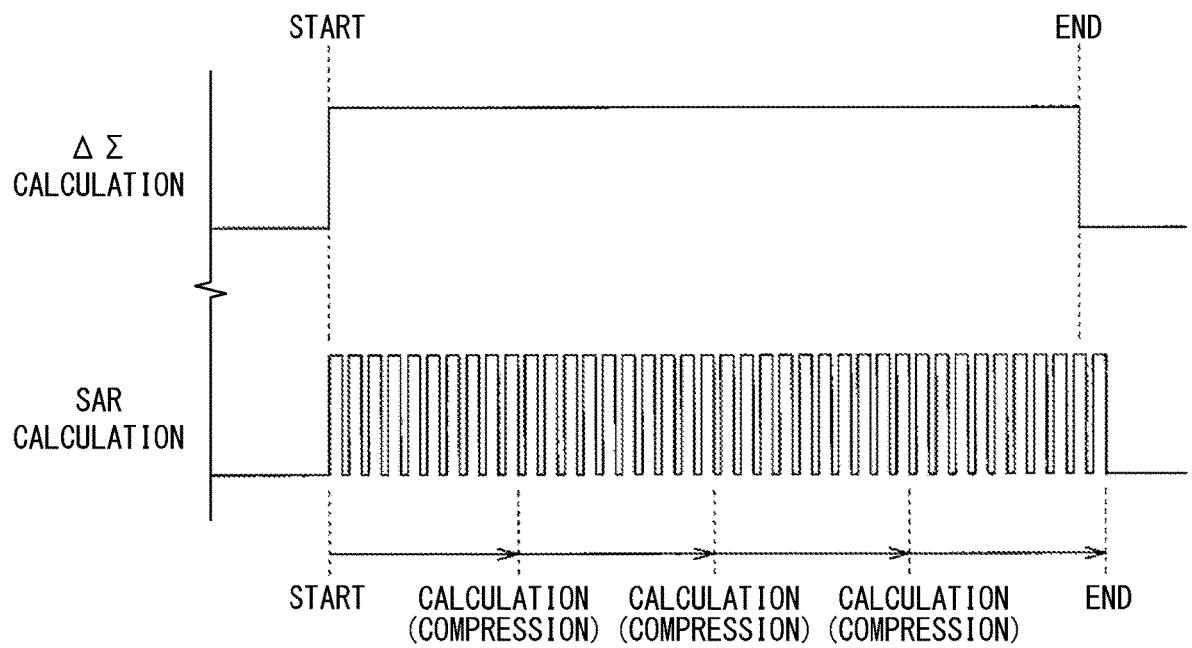
FIG. 7 is a schematic view showing a comparison of conversion time required for delta-sigma calculation and conversion time required for SAR calculation.

The time period required for the successive comparison calculation (SAR calculation) in the sub ADC 63 is extremely shorter than the time period required for the ΔΣ calculation in the main ADC 50, and the SAR calculation are repeated by many times until the ΔΣ calculation is completed as shown in FIG. 7. That is, the above-described compression is repeated many times in one time ΔΣ calculation.

Specifically, the compressed data storing area 67 includes a first area CE1 to a fourth area CE4, and the latest compressed data is stored in the fourth area CE4. When storing the latest compressed data in the fourth area CE4, the compressed data previously stored in the fourth area CE4 is shifted to the third area CE3, the compressed data previously stored in the third area CE3 is shifted to the second area CE2, the compressed data previously stored in the second area CE2 is shifted to the first area CE1, and the oldest compressed data stored in the first area CE1 is erased. That is, the compressed data stored in the compressed data storage area 67 is updated as needed until the accumulation of data is completed so that the stored compressed data maintain the latest (newest) four records of conversion data.

Further, in the data accumulation start process in S205, the control signal (synchronous signal) is also output to the second MCU 70. The second MCU 70 also starts to accumulate the conversion data by the sub ADC 73 in response to the reception of the control signal. As shown in FIG. 6, similar to the storage 62 of the first MCU 60, the storage 72 of the second MCU 70 includes a conversion data storing area 76, and the conversion data storing area 76 includes a first area BE1 to a tenth area BE10. The conversion data converted by the sub ADC 73 is stored in the first area BE1, the second area BE2, the third area BE3, . . . , and the tenth area in order. When all of the first area BE1 to the tenth area BE10 are full, the average value of the conversion data is calculated and the conversion data stored in the first area BE1 to the tenth area BE10 are deleted. Then, the calculated result is stored, as compressed data, in the compressed data storing area 77 of the storage 72. As described above, by compressing the conversion data, it is possible to prevent the number of data to be stored from becoming excessively large.

Similar to the compressed data storing area 67 of the first MCU 60, the compressed data storing area 77 of the second MCU 70 includes a first area CE1 to a fourth area CE4, and the latest compressed data is stored in the fourth area CE4. When storing the latest compressed data in the fourth area CE4, the compressed data previously stored in the fourth area CE4 is shifted to the third area CE3, the compressed data previously stored in the third area CE3 is shifted to the second area CE2, the compressed data previously stored in the second area CE2 is shifted to the first area CE1, and the oldest compressed data stored in the first area CE1 is erased. That is, the compressed data stored in the compressed data storage area 77 is updated as needed until the accumulation of data is completed so that the stored compressed data maintain the latest (newest) four records of conversion data.

Returning to the description of the diagnosis process shown in FIG. 5, if an affirmative determination is made in S202, that is, if a response from the main ADC 50 is being awaited, the process proceeds to S206. In S206, the controller 61 determines whether a response is received from the main ADC 50, that is, whether the conversion data of the main ADC 50 is acquired. If a negative determination is made in S206, the current diagnosis process is ended. If an affirmative determination is made in S206, the process proceeds to S207. In S207, the controller 61 executes calculation data preparation process.

In the calculation data preparation process of S207, the controller 61 sets a calculation data preparation end flag. In response to the calculation data preparation end flag being set, the conversion in the sub ADC 63 is completed at a time when all of the first area BE1 to the tenth area BE10 of the conversion data storing area 76 are full, and further accumulation of conversion data can be avoided. Further, in the calculation data preparation process, the controller 61 further executes the following instruction toward the second MCU 70. At the time when all of the first area BE1 to the tenth area BE10 of the conversion data storing area 76 of the second MCU 70 are full, further accumulation of conversion data is instructed to be deactivated.

Returning to the description of S201, if an affirmative determination is made in S201, that is, if the calculation data preparation end flag is already set in S207, the process proceeds to S208. In S208, the controller 61 determines whether the preparation of the calculation data is completed. Specifically, the controller 61 determines whether the calculation data related to the sub ADC 63 and the calculation data related to the sub ADC 73 are prepared.

Specifically, under the condition that the calculation data preparation end flag is set, each time the conversion data storing area 66 (first area BE1 to tenth area BE10) of the first MCU 60 is completely full, the compressed data stored in the compressed data storing area 67 is updated. When the compressed data storing area 67 is updated, an average value of the first area CE1 to the fourth area CE4 of the compressed data storing area 67 is calculated. This calculation result corresponds to a first calculation data adopted as a basis for setting the reference range DE. That is, the calculation data related to the sub ADC 63 is a moving average of the conversion data of the sub ADC 63. The calculation of average value of the compressed data by the controller 61 corresponds to a first calculator.

Similar to the first MCU 60, in the second MCU 70, under the condition that the calculation data preparation end flag is set, each time the conversion data storing area 76 (first area BE1 to tenth area BE10) of the second MCU 70 is completely full, the compressed data stored in the compressed data storing area 77 is updated. When the compressed data storing area 77 is updated, an average value of the first area CE1 to the fourth area CE4 of the compressed data storing area 77 is calculated. This calculation result corresponds to a second calculation data adopted as the basis for setting the reference range DE. That is, the calculation data related to the sub ADC 73 is a moving average of the conversion data of the sub ADC 73. The calculation data related to the sub ADC 73 is promptly transmitted to the first MCU 60 after the calculation is completed. The calculation of average value of the compressed data by the controller 71 corresponds to a second calculator.

When the two calculation data records related to the sub ADCs 63 and 73 are not available, a negative determination is made in S208 and the current diagnosis process is ended. When the two calculation data records related to the sub ADCs 63 and 73 are available, an affirmative determination is made in S208, and the process proceeds to S209.

In S209, a calculation data comparison process is executed. In the present example, the sub ADC 63 of the first MCU 60 and the sub ADC 73 of the second MCU 70 have the same conversion accuracy (for example, catalog value) as defined in the product specifications. More specifically, the first MCU 60 and the second MCU 70 are provided by the same product. In the present embodiment, in the comparison process of S209, a permissible range of the calculation data, within which the difference or deviation of two calculation data is permitted, is defined as twice of the conversion accuracy of the sub ADC 63, 73. The conversion accuracy of each sub ADC 63, 73 is defined as ±0.5% in the present embodiment.

Figure 8A:
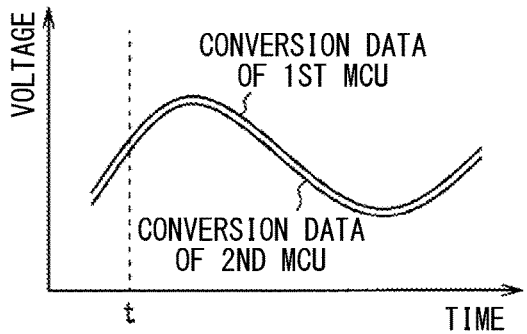
FIG. 8A is a schematic view showing conversion data of first MCU and conversion data of second MCU.
Figure 8B:
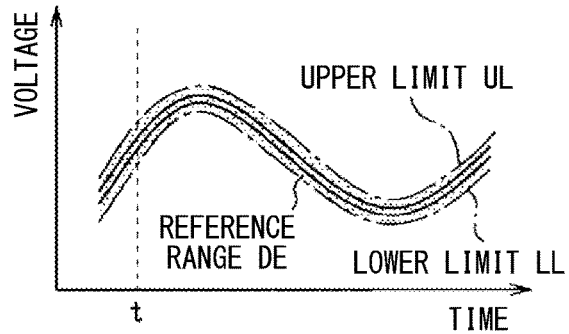
FIG. 8B is a schematic view showing a relationship between each conversion data (calculation data) and a reference range.

When the difference (deviation) between the two calculation data is within the permissible range, an affirmative determination is made in S210 and the process proceeds to S211. In S211, the controller 61 sets the reference range DE which is a reference for diagnosing the conversion data of the main ADC 50. The process executed by the controller 61 in S211 corresponds to a setting unit. The following will describe a setting of the reference range DE in a supplementary manner with reference to FIG. 7, FIG. 8A, and FIG. 8B. In the following description, for convenience, the reference accuracy (margin of error) to be guaranteed by the diagnosis is referred to as ±α, the conversion accuracy (conversion error) of the sub ADCs 63 and 73 is referred to as ±β, and the conversion accuracy of the main ADC 50 (conversion error) is referred to as ±γ.

Figure 9:
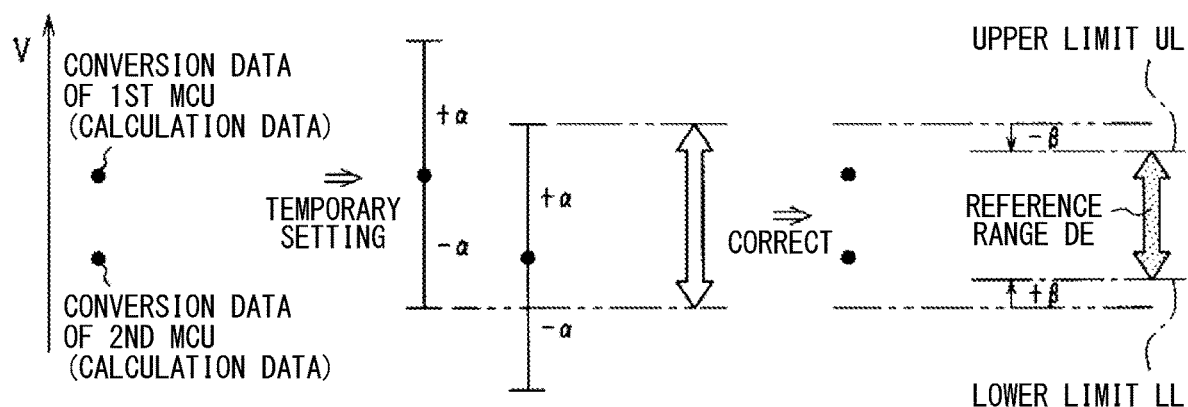
FIG. 9 is a schematic view showing a setting flow of a reference range.

As described above, the sub ADC 63 of the first MCU 60 and the sub ADC 73 of the second MCU 70 have the same conversion accuracy (for example, catalog value) as defined in the product specifications. However, even if the conversion accuracies defined in the product specifications are the same, the conversion data may differ due to individual difference in each product (see FIG. 8A and FIG. 8B). In the present embodiment, when setting the reference range DE, as shown in FIG. 9, an upper limit UL and a lower limit LL of the reference range DE are determined based on the calculation data which is the average value of the conversion data group converted by the sub ADC 63 of the first MCU 60, calculation data which is the average value of the conversion data group converted by the sub ADC 73 of the second MCU 70, the reference accuracy ±α, the conversion accuracy ±β of the sub ADC 63, 73.

Specifically, a temporary lower limit is determined by subtracting an absolute value α of the reference accuracy from the larger one of the two calculation data related to the two sub ADCs, respectively. A temporary upper limit is determined by adding the absolute value α of the reference accuracy to the smaller one of the two calculation data related to the two sub ADCs, respectively. That is, when the reference accuracy ±α are added to each of the two conversion data of the two sub ADCs, a portion where both ranges overlap is determined as a temporary reference range. Then, the temporarily determined range is corrected using the conversion accuracy ±β of the sub ADC. Specifically, an upper limit UL is determined by subtracting an absolute value β from the temporary upper limit, and a lower limit LL is determined by adding the absolute value β to the temporary lower limit. By narrowing (compressing) the temporary reference range in this way, the reference range DE as a diagnosis reference is set.

Returning to the description of the diagnosis process of FIG. 5, after the setting process in S211 is executed, the diagnosis process (comparison process) is executed in S212. Specifically, the process determines whether the conversion data acquired from the main ADC 50 is within the reference range DE even when the conversion accuracy ±γ of the main ADC 50 is taken into consideration. The process executed by the controller 61 in S212 corresponds to a comparing unit.

Figure 10:
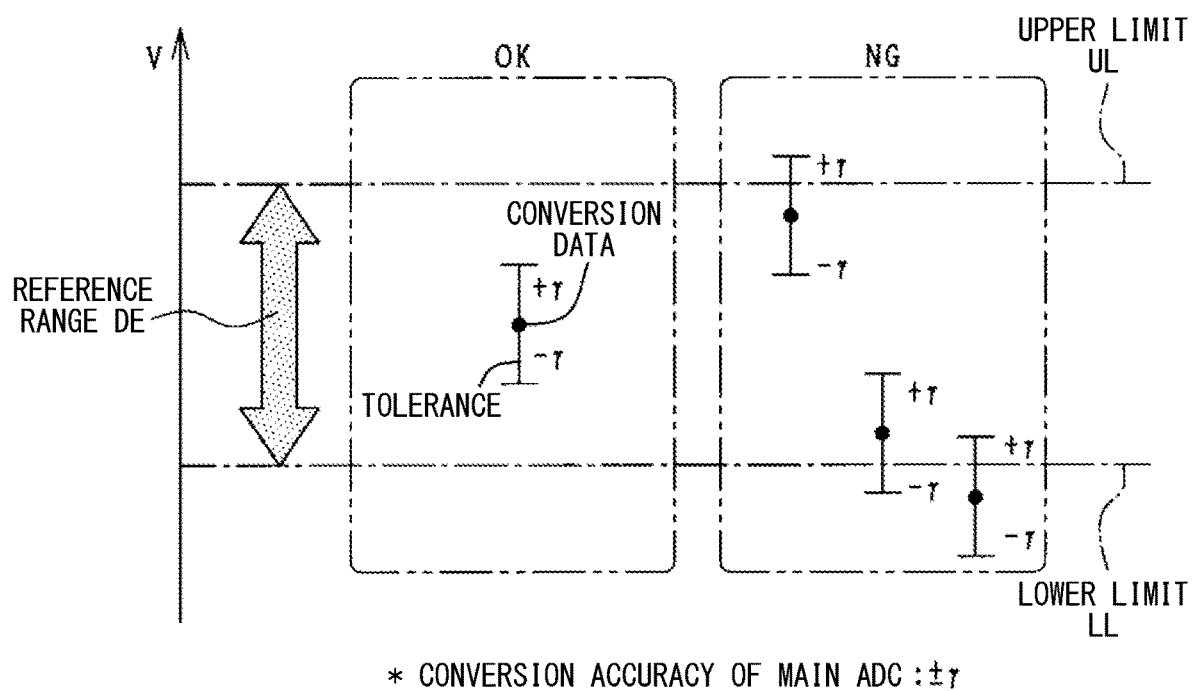
FIG. 10 is a schematic view showing a relationship between a reference range and conversion data of main ADC.

When a value range obtained by adding the conversion accuracy ±γ of the main ADC 50 to the conversion data of the main ADC 50 is within the reference range DE, the process determines that the conversion data of the main ADC 50 conforms to the reference accuracy as shown by a dotted square with OK in FIG. 10. On the other hand, (i) when the conversion data of the main ADC 50 is not included in the reference range DE, or (ii) the value range obtained by adding the conversion accuracy ±γ of the main ADC 50 to the conversion data of the main ADC 50 is not entirely included in the reference range DE, that is, a part of the value range exceeds the value range, the process determines that the conversion data of the main ADC 50 does not conform to the reference accuracy as shown by a dotted square with NG in FIG. 10.

When the conversion data of the main ADC 50 conforms to the reference accuracy, an affirmative determination is made in S213, and the conversion data setting process is executed in S214. In this setting process, the conversion data of the main ADC 50 is set in the backplane 40. On the other hand, when the conversion data of the main ADC 50 does not conform to the reference accuracy (S213: NO), or when a negative determination is made in S210 (that is, when the deviation of the calculation data exceeds the permissible range), an error process is executed in S215.

In the error process of S215, the conversion data to be set in the backplane 40 is forcibly rewritten to special data (for example, 0V/0 mA) corresponding to the occurrence of the error. In the present embodiment, the special data functions as a notification means that notifies the control device C of an occurrence of operation abnormality in the input module 10 (specifically, in the main ADC 50). Then, the conversion data is restricted from being set in the backplane 40 at least until the error removing condition is satisfied (for example, until the error removing operation is executed). The control device C can obtain the information indicating occurrence of an error in the main ADC or MCU due to the input of the special data.

In order to differentiate the abnormality notification in S215 from the abnormality notification in S105 and to enable the control device C to identify what kind of error has occurred in the input module 10, the special data set in the backplane 40 corresponding to each error type may be set different from one another according to the error type.

After executing the processes in S214 and S215, the process proceeds to S216, and various data such as calculation data are erased and the current diagnosis process is ended. The specific method of data erasing may be properly set.

The present embodiment can provide the following effects.

The main ADC 50 is provided by an integrated circuit dedicated to analog-to-digital conversion, and is provided separately from the MCUs 60 and 70. Thus, restrictions on improvement of conversion accuracy and the like can be suitably relaxed. This configuration can provide high accuracy of the control system. The input module 10 shown in the present embodiment includes multiple sub ADCs 63 and 73 in addition to the main ADC 50, and the analog signal from the sensor S is converted into the digital signal by the main ADC 50 and the sub ADCs 63 and 73, respectively. Then, the reference range DE is set based on the conversion data of the multiple digital signals converted by the sub ADCs 63 and 73, respectively. By comparing the reference range DE with the conversion data of the main ADC 50, it is possible to identify that an error exceeding the reference accuracy has occurred in the conversion data of the main ADC 50.

In the present embodiment, a reliability of the reference range DE is improved by using, in combination, multiple sub ADCs 63 and 73 which have low conversion accuracies and function as monitoring ADCs. As a result, it is possible to improve the reliability of the control system while securing the control accuracy of the control system.

The conversion accuracy of the ADC is related to the conversion time required for conversion operation. When the accuracy of the conversion operation is increased, the conversion time tends to extend. As described above, although the conversion accuracies of the sub ADCs 63 and 73 are suppressed to be lower than the conversion accuracy of the main ADC 50, the conversion time required for conversion operation is shorter than that of the main ADC 50. As a result, it is possible to prevent the input of the conversion data (data converted by the main ADC 50) to the control device C from being significantly delayed due to the addition of the monitoring function.

When the reference range DE is set based on the conversion data (specifically, calculation data) of the built-in sub ADC 63, 73 of the MCU 60, 70 even in a case where a reliability of the sub ADC 63 and 73 cannot be guaranteed due to an operation abnormality occurred in any one of the MCUs 60 and 70, the following problem will occur. The conversion data that should be determined to not conform to the reference accuracy may be output to the control device C without any correction. In the configuration of the present embodiment, the operation abnormality of the MCUs 60 and 70 can be quickly detected by mutual monitoring configuration of the MCUs 60 and 70. Thus, the output of the conversion data that should be determined to abnormal can be avoided.

The conversion accuracy of the sub ADC 63 of the first MCU 60 and the conversion accuracy of the sub ADC 73 of the second MCU 70 defined in the product specifications are the same. By adopting sub ADCs having the same conversion accuracy, the configuration for setting the reference range DE based on the conversion data (specifically, the calculation data) of the sub ADCs 63 and 73 can be simplified.

Even though the reference range DE is set using the built-in ADC of the MCU (general purpose product) that have low conversion accuracy, for example, the lower limit LL of the reference range DE is determined by subtracting the absolute value β of the conversion accuracy of the sub ADC 63, 73 from the relatively large conversion data (specifically, the calculation data) of the sub ADC 63, 73 and the upper limit UL of the reference range DE is determined by adding the absolute value β of the conversion accuracy of the sub ADC 63, 73 to the relatively small conversion data (specifically, the calculation data) of the sub ADC 63, 73, it is possible to suppress that the low conversion accuracy of the built-in ADC of the general purpose product substantially affects the accuracy of the diagnosis result.

By setting the reference range DE after the completion of conversion by the main ADC 50, it is possible to suppress a decrease in diagnosis accuracy due to a difference between the conversion completion time of the main ADC 50 and the conversion completion time of the sub ADC 63, 73. While waiting for the completion of conversion by the main ADC 50, the conversion data (compressed data) of the sub ADC 63, 73 are accumulated, and the average value is calculated from predetermined record number of the conversion data. Thus, although the conversion data of sub ADC 63, 73 having low accuracy are used, the diagnosis accuracy can be suitably improved by this configuration. When the average value is calculated by the moving average as described in the above embodiment, it is possible to prevent a lack of the storing area of the storage 62, 72 and also possible to prevent all storing area of the storage 62, 72 being occupied by the conversion data and the calculation data. In a configuration where the conversion time depends on the filter setting of the main ADC 50, by suppressing the influence on the conversion time as described above, more flexible filter settings can be provided.

The conversion data of the main ADC is compared with the reference range DE. Since the reference range DE is set corresponding to each time conversion in the sub ADC, the diagnosis accuracy can be improved. However, extension of the time until completion of the reference range DE is not favorable. In the present embodiment, the controller 61, 71 of each MCU 60, 70 is configured to store the conversion data and execute the calculation of the average value. Compared with a case where a single microcomputer is configured to execute these operations instead of the two MCUs, a responsiveness in setting of the reference range DE can be suitably improved.

OTHER EMBODIMENTS

The present disclosure is not limited to the above-described embodiment, and may be carried out in the following embodiments. Each of the following configurations may be individually applied to the above-described embodiment, or partial or entire of the following configurations may be combined and then applied to the above-described embodiment.

In the above embodiment, the lower limit LL of the reference range DE is determined based on the relatively large average value of the conversion data (average value) of each sub ADC 63, 73, and the upper limit UL of the reference range DE is determined based on the relatively small average value. Alternatively, the setting of upper and lower limits can be configured as follows. The upper limit UL of the reference range DE may be determined based on both conversion data (average values) of sub ADCs 63, 73, and the lower limit LL of the reference range DE may be determined based on both conversion data (average values) of sub ADCs 63, 73. For example, a median value (average value) of the two average values may be calculated, and the upper limit UL and the lower limit LL of the reference range DE may be determined based on the calculated median value.

In the above embodiment, the reference range compared with the conversion data for diagnosing the conversion data is narrowed (corrected) with consideration of the conversion accuracy of the sub ADC 63, 73. Alternatively, the following configuration may be adopted. In the configuration where the diagnosis is performed by comparing the reference range with the conversion data of the main ADC, the conversion data of the main ADC 50 can be set as the target of correction. Specifically, when the conversion data of the main ADC 50 is configured to have a range as shown in FIG. 9, it is preferable to add (extend vertically) the absolute value β of the conversion accuracy of the sub ADC 63, 73.

In the above embodiment, the first MCU 60 and the second MCU 70 are configured to use the same product having the same product specifications in order to provide the same conversion accuracy. Under a condition that conversion accuracies of the sub ADCs are the same, the MCU does not necessarily have to be the same product.

Regarding the sub ADCs whose accuracies are inferior to that of the main ADC 50, the accuracy of the reference range DE (predetermined threshold value) is improved by increasing the number of sub ADCs. It is not always necessary to match the product specification (conversion accuracy) of the sub ADC 63 of the first MCU 60 with the product specification (conversion accuracy) of the sub ADC 73 of the second MCU 70. That is, a configuration which adopts multiple sub ADCs having different conversion accuracies is also included in the present disclosure.

In the above embodiment, the two MCUs 60 and 70 are used in combination, and the operations of the MCUs 60 and 70 are mutually monitored by one another. The present disclosure is not limited to this configuration. The monitoring function of the MCU may be omitted. In this case, the number of monitoring MCUs included in the input module 10 may be only one, and another one of the sub ADC may be provided in another integrated circuit (dedicated product) dedicated to analog-to-digital conversion provided separately from the MCU.

In the above embodiment, the main ADC 50 is provided by the ΔΣ type ADC. The present disclosure is not limited to this configuration. The ADC type may be any type under a condition that the conversion accuracy of the main ADC is higher than those of the diagnosis purpose built-in sub ADCs 63, 73 included in the MCUs 60, 70.

In the above embodiment, the conversion data of the sub ADC 63, 73 is stored in the storage 62, 72, and the average value of the conversion data is calculated by the moving average to suppress the difference from the conversion data (result of ΔΣ calculation) of the main ADC 50. The present disclosure is not limited to this configuration. In order to reduce variation in the conversion data of the sub ADC 63, 73 and to improve the accuracy of the reference range DE, it is possible to calculate the average value by other operations, such as arithmetic mean and weighted average other than moving average.

In the above embodiment, when the conversion data of the main ADC 50 is determined to not conform to the reference range DE, special data indicating that the conversion data does not conform to the reference range is set in the backplane 40 instead of the conversion data as the error process. Alternatively, the specific operation of the error process may be set differently under a condition that nonconformity of the conversion data with the reference range can be specified on the side of the control device C. For example, a signal indicating the abnormality occurrence may be output separately from the conversion data. Instead of or in addition to above-described configuration, a response to a request from the controller may be forbidden when the abnormality occurrence is confirmed.

In the above embodiment, the number of MCUs (sub-ADCs) included in the input module 10 is two. Alternatively, the number of MCUs may be three, four, or more. In this case, the reference range DE may be set based on conversion data of entire sub ADCs. Alternatively, the reference range DE may be set based on conversion data of partial sub ADCs.

In the above embodiment, the conversion data of the main ADC 50 is monitored (diagnosed) by the built-in sub ADC 63 of the first MCU 60 and the built-in sub ADC 73 of the second MCU 70. The present disclosure is not limited to this configuration. For example, a single one MCU having multiple built-in sub ADCs may be included in the input module 10, and the conversion data of the main ADC 50 may be monitored (diagnosed) by using the multiple built-in sub ADCs included in the MCU.

In the above embodiment, the input module 10 does not include the sensor S. Alternatively, the input module 10 may include the sensor S.

In the above embodiment, the input module 10 is applied to the valve control system as an example. Alternatively, the input module 10 may be applied to another control system of industrial equipment. For example, the input module may be applied to a control system of a processing equipment, an assembly equipment, and a transportation equipment.

What is claimed is:

1. An analog-to-digital converting device applied to a control system that controls an industrial equipment as a control target, the analog-to-digital converting device comprising:
a main analog-to-digital converter integrated circuit configured to convert an analog signal, which is output from a sensor and input to the analog-to-digital converting device, to a digital signal;
a first microcomputer configured to convert the analog signal to a digital signal with a conversion accuracy lower than a conversion accuracy of the main analog-to-digital converter integrated circuit; and
a second microcomputer configured to:
convert the analog signal to a digital signal with a conversion accuracy lower than the conversion accuracy of the main analog-to-digital converter integrated circuit; and
monitor an operation of the first microcomputer;
the first microcomputer being configured to monitor an operation of the second microcomputer,
at least one of the first microcomputer and the second microcomputer being configured to:
monitor the digital signal converted by the main analog-to-digital converter integrated circuit;
set a predetermined threshold based on conversion values of the digital signals converted by the first and second microcomputers; and
compare a conversion value of the digital signal converted by the main analog-to-digital converter integrated circuit with the predetermined threshold.

2. The analog-to-digital converting device according to claim 1, wherein
the conversion accuracy of the first microcomputer is identical to or approximately same as the conversion accuracy of the second microcomputer.

3. The analog-to-digital converting device according to claim 2, wherein the at least one of the first microcomputer and the second microcomputer is configured to:
set a lower limit of the predetermined threshold based on a relatively large conversion value among the conversion value of the first microcomputer and the conversion value of the second microcomputer, and
set an upper limit of the predetermined threshold based on a relatively small conversion value among the conversion value of the first microcomputer and the conversion value of the second microcomputer.

4. The analog-to-digital converting device according to claim 2, wherein the at least one of the first microcomputer and the second microcomputer is configured to:
set a lower limit of the predetermined threshold by subtracting a predetermined positive value from a relatively large conversion value among the conversion value of the first microcomputer and the conversion value of the second microcomputer, and
set an upper limit of the predetermined threshold by adding the predetermined positive value to a relatively small conversion value among the conversion value of the first microcomputer and the conversion value of the second microcomputer.

5. The analog-to-digital converting device according to claim 4, wherein the at least one of the first microcomputer and the second microcomputer is configured to:
decrease the upper limit of the predetermined threshold according to the conversion accuracy of the first or second microcomputer, and
increase the lower limit of the predetermined threshold according to the conversion accuracy of the first or second microcomputer.

6. The analog-to-digital converting device according to claim 2, wherein the at least one of the first microcomputer and the second microcomputer is configured to:
compare the conversion value of the digital signal converted by the first microcomputer with the conversion value of the digital signal converted by the second analog to digital microcomputer,
when a difference between the conversion value of the digital signal converted by the first microcomputer and the conversion value of the digital signal converted by the second microcomputer is equal to or greater than a predetermined difference threshold, execute a predetermined error process, and the predetermined difference threshold is previously determined based on the conversion accuracy of the first or second microcomputer.

7. The analog-to-digital converting device according to claim 1, wherein the main analog-to-digital converter integrated circuit is a ΔΣ type analog-to-digital converter, and each of the first and second microcomputers is configured to function as a successive approximation register (SAR) type analog-to-digital converter.

8. The analog-to-digital converting device according to claim 1, wherein a conversion time required for each of the first and second microcomputers is shorter than a conversion time required for the main analog-to-digital converter, in a case where the at least one of the first microcomputer and the second microcomputer outputs a conversion start instruction to the main analog-to-digital converter integrated circuit in response to a predetermined start trigger being activated, the at least one of the first microcomputer and the second microcomputer starts to store the conversion values or correlation values related to the conversion values of the first and second microcomputers, and the at least one of the first microcomputer and the second microcomputer is configured to wait for a completion of conversion by the main analog-to-digital converter integrated circuit, calculate an average value based on the stored conversion values or the correlation values, and set the predetermined threshold based on the calculated average value.

9. The analog-to-digital converting device according to claim 8, wherein at least one of the first microcomputer and the second microcomputer is configured to:

calculate the average value, based on which the predetermined threshold is set, by a moving average method.

10. The analog-to-digital converting device according to claim 8, wherein the first microcomputer includes:
a first storage storing the conversion values or the correlation values related to the conversion values of the first microcomputer; and
a first calculator calculating the average value of the conversion values or the correlation values stored in the first storage, and the second microcomputer includes:
a second storage storing the conversion values or the correlation values related to the conversion values of the second microcomputer; and
a second calculator calculating the average value of the conversion values or the correlation values stored in the second storage.

11. The analog-to-digital converting device according to claim 1, further comprising an output configured to:
when a comparison result indicates that the conversion value of the digital signal converted by the main analog-to-digital converter integrated circuit is within a range of the predetermined threshold, output the conversion value of the main analog-to-digital converter integrated circuit to the control system of the industrial equipment, and when the comparison result indicates that the conversion value of the digital signal converted by the main analog-to-digital converter integrated circuit is not within the range of the predetermined threshold, output, instead of the conversion value of the main analog-to-digital converter integrated circuit, a predetermined value indicating the comparison result to the control system of the industrial equipment.

12. A control system comprising:

the analog-to-digital converting device according to claim 1, wherein the control system controls an industrial equipment based on a digital signal, which is output from the analog-to-digital converting device and input to the control system.

13. An analog-to-digital converting device comprising:

a main analog-to-digital converter integrated circuit configured to convert an analog signal, which is output from a sensor and input to the analog-to-digital converting device, to a digital signal;

a first microcomputer configured to convert the analog signal to a digital signal with a conversion accuracy lower than a conversion accuracy of the main analog-to-digital converter integrated circuit; and a second microcomputer configured to:
convert the analog signal to a digital signal with a conversion accuracy lower than the conversion accuracy of the main analog-to-digital converter integrated circuit; and
monitor an operation of the first microcomputer;

the first microcomputer being configured to monitor an operation of the second microcomputer, at least one of the first microcomputer and the second microcomputer being configured to:
monitor the digital signal converted by the main analog-to-digital converter integrated circuit;
set a predetermined threshold based on conversion values of the digital signals converted by the first and second microcomputers; and
compare a conversion value of the digital signal converted by the main analog-to-digital converter integrated circuit with the predetermined threshold, wherein the analog-to-digital converting device is applied to a control system that controls an industrial equipment as a control target.

* * * * *